United States Patent
Naganawa (10) Patent No.: US 9,577,211 B2
(45) Date of Patent: Feb. 21, 2017

(54) ORGANIC ELECTRONIC ELEMENT AND METHOD FOR MANUFACTURING ORGANIC ELECTRONIC ELEMENT

(71) Applicant: LINTEC Corporation, Tokyo (JP)

(72) Inventor: Satoshi Naganawa, Tokyo (JP)

(73) Assignee: LINTEC CORPORATION, Tokyo (JP)

(*) Notice: Subject to any disclaimer, the term of this patent is extended or adjusted under 35 U.S.C. 154(b) by 45 days.

(21) Appl. No.: 14/378,687

(22) PCT Filed: Feb. 6, 2013

(86) PCT No.: PCT/JP2013/052748
§ 371 (c)(1),
(2) Date: Aug. 14, 2014

(87) PCT Pub. No.: WO2013/125352
PCT Pub. Date: Aug. 29, 2013

(65) Prior Publication Data
US 2016/0028041 A1    Jan. 28, 2016

(30) Foreign Application Priority Data
Feb. 21, 2012  (JP) ................ 2012-035105

(51) Int. Cl.
*H01L 51/52* (2006.01)
*H01L 51/44* (2006.01)
*H01L 51/56* (2006.01)

(52) U.S. Cl.
CPC ........ *H01L 51/5237* (2013.01); *H01L 51/448* (2013.01); *H01L 51/5253* (2013.01);
(Continued)

(58) Field of Classification Search
None
See application file for complete search history.

(56) References Cited

U.S. PATENT DOCUMENTS 6,617,052 B2* 9/2003 Morii ................ H01L 51/5237
257/100
6,692,326 B2* 2/2004 Choi ................ H01L 51/5237
427/66
(Continued)

FOREIGN PATENT DOCUMENTS

CN    1575050 A    2/2005
EP    1484805 A2    8/2004
(Continued)

OTHER PUBLICATIONS

Supplementary European Search Report mailed Sep. 23, 2015, for European Application No. 13752126.6.
(Continued)

*Primary Examiner* — Abul Kalam
(74) *Attorney, Agent, or Firm* — Fitch, Even, Tabin & Flannery LLP (57) ABSTRACT

Provided are an organic electronic element equipped with a sealing layer having excellent gas barrier properties, transparency and the like, and a method for efficiently manufacturing such an organic electronic element. Disclosed are an organic electronic element including, on a substrate, a first electrode and a second electrode facing each other, with at least one organic functional layer being interposed therebetween, and a method for manufacturing such an organic electronic element, characterized in that a sealing layer is directly provided along the top surface and the lateral surface of the organic electronic element, and the sealing layer is obtained by implanting plasma ions into a coating film containing a silicon compound as a main component.

6 Claims, 6 Drawing Sheets

(52) U.S. Cl.
CPC .......... *H01L 51/56* (2013.01); *H01L 51/5275* (2013.01); *Y02E 10/549* (2013.01); *Y02P 70/521* (2015.11)

(56) References Cited

U.S. PATENT DOCUMENTS

| | | | |
|---|---|---|---|
| 8,771,834 B2 | 7/2014 | Uemura et al. | |
| 8,846,200 B2 | 9/2014 | Ito et al. | |
| 8,906,492 B2 | 12/2014 | Suzuki et al. | |
| 2002/0113241 A1 | 8/2002 | Kubota et al. | |
| 2003/0003225 A1* | 1/2003 | Choi | H01L 51/5237 427/66 |
| 2003/0129451 A1 | 7/2003 | Nukada et al. | |
| 2004/0081912 A1 | 4/2004 | Nagahara et al. | |
| 2004/0247938 A1 | 12/2004 | Yamaguchi et al. | |
| 2005/0100853 A1 | 5/2005 | Tadros et al. | |
| 2007/0120108 A1 | 5/2007 | Asabe | |
| 2008/0023442 A1 | 1/2008 | Ito et al. | |
| 2008/0199977 A1 | 8/2008 | Weigel et al. | |
| 2008/0319121 A1 | 12/2008 | Mitani et al. | |
| 2010/0019654 A1 | 1/2010 | Hayashi | |
| 2011/0041913 A1 | 2/2011 | Luecke et al. | |
| 2011/0121270 A1 | 5/2011 | Kim et al. | |
| 2012/0064321 A1 | 3/2012 | Suzuki et al. | |
| 2012/0107607 A1* | 5/2012 | Takaki | C08J 7/047 428/336 |
| 2012/0241889 A1 | 9/2012 | Takemura et al. | |
| 2012/0295120 A1* | 11/2012 | Nagamoto | C23C 14/48 428/447 |
| 2013/0047889 A1* | 2/2013 | Iwaya | C08J 7/123 106/286.8 |
| 2013/0068136 A1 | 3/2013 | Iwaya et al. | |
| 2013/0202900 A1 | 8/2013 | Uemura et al. | |
| 2013/0224503 A1 | 8/2013 | Suzuki et al. | |
| 2013/0244044 A1 | 9/2013 | Ito et al. | |
| 2014/0342149 A1 | 11/2014 | Naganawa et al. | |
| 2014/0374665 A1 | 12/2014 | Iwaya et al. | |
| 2015/0287954 A1 | 10/2015 | Naganawa et al. | |
| 2015/0367602 A1 | 12/2015 | Iwaya et al. | |

FOREIGN PATENT DOCUMENTS

| | | |
|---|---|---|
| EP | 241005 A1 | 1/2012 |
| JP | 2001-171047 A | 6/2001 |
| JP | 2002-231443 A | 8/2002 |
| JP | 2007-59131 A | 3/2007 |
| JP | 2007-180014 A | 7/2007 |
| JP | 2007-237588 A | 9/2007 |
| JP | 2008-71608 A | 3/2008 |
| JP | 2009-196155 A | 9/2009 |
| JP | 2009-252574 A | 10/2009 |
| JP | 2010-27561 A | 2/2010 |
| JP | 2010-158832 A | 7/2010 |
| JP | 2010-232569 A | 10/2010 |
| JP | 2011-26645 A | 2/2011 |
| JP | 2011-36779 A | 2/2011 |
| JP | 2011-68042 A | 4/2011 |
| JP | 2011-68124 A | 4/2011 |
| JP | 2011-213847 A | 10/2011 |
| JP | 2011-213907 A | 10/2011 |
| WO | 2010107018 A1 | 9/2010 |
| WO | 2011/007543 A1 | 1/2011 |
| WO | 2011043315 A1 | 4/2011 |
| WO | 2011074440 A1 | 6/2011 |
| WO | 2013035432 A1 | 3/2013 |
| WO | 2013108487 A1 | 7/2013 |
| WO | 2013125352 A1 | 8/2013 |

OTHER PUBLICATIONS

ISO 11664-4:2008 (CIE S 014-4/E:2007) Colorimetry—Part 4:CIE 1976 L*a*b* Colour Space.

Optical constants of SiO2 (Silicon dioxide, Silica, Quartz); http://refractiveindex.info/?shelf=main&book=SiO2&page=Malitson; viewed Aug. 24, 2016.

Supplementary European Search Report mailed Aug. 20, 2015, for European Application No. 12866013.1; 9 pages.

Webster's Ninth New Collegiate Dictionary; Merriam-Webster Inc; Springfield, Massachusetts, USA; 1990; p. 671.

Hawley's Condensed Chemical Dictionary; 12th edition; Van Nostrand Reinhold Company; New York; 1993; p. 680.

Office Action mailed May 31, 2016, for U.S. Appl. No. 14/367,252.

Office Action mailed Nov. 10, 2015, for U.S. Appl. No. 14/367,252.

Office Action mailed Nov. 4, 2015, for U.S. Appl. No. 14/126,129.

Office Action mailed Apr. 20, 2016, for U.S. Appl. No. 14/126,129.

* cited by examiner

ORGANIC ELECTRONIC ELEMENT AND METHOD FOR MANUFACTURING ORGANIC ELECTRONIC ELEMENT

TECHNICAL FIELD

The present invention relates to an organic electronic element, and a method for manufacturing an organic electronic element, and more particularly, to an organic electronic element equipped with a sealing layer having excellent gas barrier performance, and a method for manufacturing an organic electronic element.

BACKGROUND ART

In recent years, research and development of organic electronic elements that use organic functional layers formed from organic compounds, is underway in a variety of fields such as organic electroluminescent elements (organic EL elements), and organic solar cells.

Among others, attention is being paid to organic electroluminescent elements (organic EL elements) as image display devices that are capable of emitting high-luminance light based on low-voltage direct current driving, and enable further progress in thickness reduction, weight reduction, and flexibility enhancement.

However, there has been a problem with organic EL elements that when the electrodes are oxidized or organic substances are degenerated due to oxygen, water vapor or the like, deterioration of the performance required as an image display device occurs, such as generation of non-emission spots (dark spots).

Thus, in order to solve such problems, there has been suggested a light emitting element (organic EL element) in which emitted light is extracted through the side of an upper electrode that faces a substrate, the light emitting element having a sealing film formed from a silicon nitride film or the like for the purpose of promoting prevention of the reflection between the sealing film and the upper electrode, and of increasing the luminescence efficiency (see, for example, Patent Document 1).

More specifically, disclosed is a light emitting element formed by sequentially laminating a lower electrode, an organic EL layer, and an upper electrode on a substrate, characterized in that a sealing material having a refractive index that is smaller than 3.5 but larger than the refractive index of air, for example, a sealing film formed from a silicon nitride film, is provided on the surface side of the upper electrode by a CVD method.

Furthermore, there has been suggested a method for manufacturing an organic EL element, which is intended to apply an inorganic sealing layer that has excellent barrier properties and is free of defects over a long time, and to reduce luminescence failure (see, for example, Patent Document 2).

More specifically, disclosed is a method for manufacturing an organic EL element, characterized by including a step of forming a first electrode layer on a substrate; a step of forming an organic luminescent medium layer (organic EL layer) on the first electrode layer; a step of forming a second electrode layer on the organic luminescent medium layer; a step of subjecting the entire substrate to a plasma treatment using a gas containing oxygen atoms (O); a step of forming an inorganic sealing layer formed from silicon nitride, silicon oxide, silicon oxynitride or the like; and a step of performing a plasma treatment on the inorganic sealing layer using a gas containing fluorine atoms (F).

Furthermore, there has been suggested an organic EL device or the like intended to realize high reliability by having a sealing layer that has enhanced durability and is formed from a silicon compound containing nitrogen (see, for example, Patent Document 3).

More specifically, disclosed is an organic EL device or the like formed by sequentially laminating a lower electrode, an organic EL layer, and an upper electrode on a substrate, characterized in that the organic EL device includes, on the surface side of the upper electrode, a sealing layer formed by alternately laminating a first gas barrier layer containing a nitrogen-containing silicon compound and a second gas barrier layer containing an oxide of a nitrogen-containing silicon compound.

Furthermore, there has been suggested a method for manufacturing a gas barrier film that is intended to be used as a substrate for organic EL elements or the like, the method including plasma-treating a polysilazane film so that a gas barrier film that can be easily manufactured can be provided without using a heating treatment or the like (see, for example, Patent Document 4).

More specifically, disclosed is a method for manufacturing a gas barrier film, characterized by forming a polysilazane film on at least one surface of a plastic film, subjecting the polysilazane film to a plasma treatment, and thereby obtaining a gas barrier film, and the method is characterized in that a gas barrier film thus obtained is used as a substrate for an organic EL element.

CITATION LIST

Patent Document

Patent Document 1: JP 2002-231443 A
Patent Document 2: JP 2008-71608 A
Patent Document 3: JP 2010-27561 A
Patent Document 4: JP 2007-237588 A

DISCLOSURE OF THE INVENTION

Problem to be Solved by the Invention

However, the sealing film formed by a CVD method as disclosed in Patent Document 1 has to use a sealing material formed from a silicon nitride film having the refractive index strictly controlled. Thus, there is a problem that the range of selection of the material is narrow, and when the sealing film is applied to an organic EL element, the gas barrier properties, adhesiveness, or transparency and the like are still poor.

Furthermore, the method for manufacturing an organic EL element disclosed in Patent Document 2 allows appropriate roughening of the sealing layer surface and securing of adhesiveness to an adhesive, by a step of performing a plasma treatment using a gas containing F atoms on the sealing layer formed from silicon nitride, silicon oxide, silicon oxynitride, or the like; however, there is a problem that the gas barrier properties of the sealing layer are considered insufficient.

Furthermore, the method for manufacturing an organic EL element disclosed in Patent Document 3 has a problem that a first gas barrier layer containing a nitrogen-containing silicon compound, and a second gas barrier layer containing an oxide of a nitrogen-containing silicon compound have to be alternately laminated as the sealing layer, so that the number of processes may increase excessively, or the production time is prone to be lengthened.

Moreover, in the method for manufacturing a gas barrier film that is applied to an organic EL element substrate or the like as disclosed in Patent Document 4, a polysilazane film is formed on a film and then is subjected to a plasma treatment, and this is used as a gas barrier film. However, since the processing does not proceed to a plasma ion implantation treatment, there is a problem that the gas barrier properties in the organic EL element are still insufficient.

Thus, the inventors of the present invention conducted a thorough investigation on such problems, and as a result, the inventors found that when a coating liquid containing a silicon compound as a main component is applied directly on the top surface and the lateral surface of an organic electronic element such as an organic EL element or a solar cell to thereby form a coating film directly, and plasma ions are implanted into the coating film, not only the top surface but also lateral surface of the organic electronic element can be compactly and efficiently sealed. Thus, the inventors completed the present invention.

That is, an object of the present invention is to provide an organic electronic element that includes, as a sealing layer, a plasma ion-implanted film having excellent gas barrier properties, transparency and the like and containing a silicon compound as a main component, so as to directly surround the element, and to provide a method for efficiently manufacturing such an organic electronic element.

Means for Solving Problem

According to the present invention, there is provided an organic electronic element which includes, on a substrate, a first electrode and a second electrode facing each other, with at least one organic functional layer being interposed therebetween, characterized in that a sealing layer is provided directly along the top surface and the lateral surface of the organic electronic element, and the sealing layer is obtained by implanting plasma ions into a coating film containing a silicon compound as a main component. Thus, the problems described above can be solved.

That is, when a silicon compound is applied directly on the top surface and lateral surface of an organic electronic element such as an organic EL element or a solar cell, a coating film having an arbitrary uniform thickness can be formed along the top surface and the lateral surface while conforming to the surface asperities of the surface or the like. Then, when plasma ions are implanted into such a coating film, the top surface as well as the lateral surface of the organic electronic element can be sealed compactly and efficiently by the sealing layer that has been formed three-dimensionally.

Therefore, in the case of an organic electronic element equipped with a sealing layer, even if the organic electronic element has an image display unit of a large screen area or the like, or even if the organic electronic element has surface unevenness (including level differences and the like) at the top surface or the lateral surface, penetration of moisture, air or the like from the outside can be efficiently prevented, and deterioration of the performance of the organic electronic element can be suppressed.

Furthermore, the organic electronic element of the present invention has superior transparency and adhesiveness compared with conventional inorganic sealing films formed by a CVD method or a sputtering method. Also, the sealing film is characterized in that on the occasion in which gas barrier properties of the same extent are to be obtained, further film thickness reduction can be achieved, the sealing layer conforms satisfactorily to the top surface and the lateral surface of the organic electronic element, and the sealing layer also has superior bendability and durability.

Figure 4A:
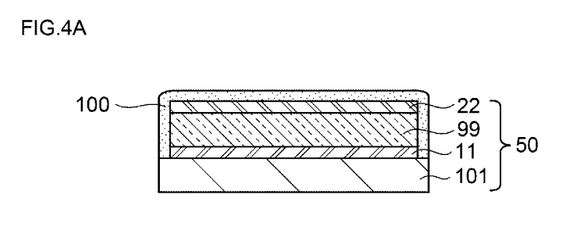
FIGS. 4A to 4C are diagrams each provided to describe an organic electronic element including a sealing layer.

Meanwhile, the top surface of the organic electronic element means the surface of the outermost layer located on the opposite side of the substrate. Therefore, for example, in a case in which the organic electronic element is an organic electronic element 50 that includes, on a substrate 101, a first electrode 11 and a second electrode 22 facing each other, with at least one organic functional layer 99 being interposed therebetween, as illustrated in FIG. 4A, the surface on the side opposite to the substrate 101 in the second electrode 22 constitutes the "top surface of the organic electronic element".

Furthermore, the lateral surface of the organic electronic element means the surface of the exposed areas positioned along the periphery of the organic electronic element. Therefore, for example, in a case in which the organic electronic element is the organic electronic element 50 including, on the substrate 101, the first electrode 11 and the second electrode 22 facing each other, with at least one organic functional layer 99 being interposed therebetween, as illustrated in FIG. 4A, the surfaces on the exposed sides of the organic functional layer 99, the first electrode 11, and the second electrode 22 constitute the "lateral surface of the organic electronic element".

In addition to that, a coating film containing a silicon compound as a main component is a film formed by directly applying a coating liquid containing a silicon compound as a main component, and the content of the silicon compound in the total solid content of the coating liquid is at least 50% by weight or more, and is preferably a value within the range of 70% to 100% by weight, and more preferably a value within the range of 80% to 95% by weight.

Furthermore, on the occasion of configuring the organic electronic element of the present invention, it is preferable that the silicon compound is at least one selected from the group consisting of a polysilazane compound, a polyorganosiloxane compound, a polysilane compound, and a polycarbosilane compound.

With such a silicon compound, the resulting sealing layer has excellent transparency, adhesiveness and the like, and also, gas barrier properties can be imparted relatively easily by implanting plasma ions.

On the occasion of configuring the organic electronic element of the present invention, it is preferable to adjust the thickness of the sealing layer to a value within the range of 10 nm to 5000 nm.

When the sealing layer has such a thickness, the sealing layer has a sufficient sealing function, and for example, even in a case in which the organic electronic element is an organic EL element, transparency, gas barrier properties or adhesiveness can be further enhanced without causing a decrease in the luminescence efficiency.

Furthermore, according to another embodiment of the present invention, there is provided an organic electronic element including, on a substrate, a first electrode and a second electrode facing each other, with at least one organic functional layer being interposed therebetween, in which a sealing layer is directly provided along the top surface and the lateral surface of the organic electronic element, the sealing layer is obtained by implanting plasma ions into a coating film formed from a polysilazane compound as a main component, and the sealing layer includes a first region having a refractive index value within the range of 1.50 to 2.0 and a second region having a refractive index value within the range of 1.40 to below 1.50, along the depth direction from the surface side.

As such, when a sealing layer composed of plural regions having different refractive indices is used, transmissibility is enhanced, and for example, even in a case in which the organic electronic element is an organic EL element, the light extracting effect is excellent so that a decrease in the luminescence efficiency can be suppressed.

On the occasion of configuring the organic electronic element of the present invention, it is preferable to adjust the film density in the first region to a value within the range of 2.3 g/cm$^3$ to 4.0 g/cm$^3$, and to adjust the film density in the second region to a value of below 2.3 g/cm$^3$.

As such, when a sealing layer composed of plural regions having different film densities is used, the gas barrier properties can be further enhanced.

Furthermore, on the occasion of configuring the organic electronic element of the present invention, the organic electronic element is characterized by being an organic electroluminescent element (organic EL element) having an organic electroluminescent layer as the organic functional layer.

When the organic electronic element is configured as an organic EL element as such, the function as a sealing layer can be easily manifested, and even if the organic EL element has a large screen or has surface unevenness on the top surface or the lateral surface, deterioration in the performance of the organic electronic element can be suppressed.

Furthermore, according to another embodiment of the present invention, there is provided a method for manufacturing an organic electronic element that includes, on a substrate, a first electrode and a second electrode facing each other, with at least one organic functional layer being interposed therebetween, and has a sealing layer directly provided along the top surface and the lateral surface of the organic electronic element, the method including steps (1) to (3) described below.

(1) an organic electronic element forming step of forming an organic electronic element by sequentially laminating a first electrode, an organic functional layer, and a second electrode on a substrate;

(2) a film forming step of directly applying a coating liquid containing a silicon compound as a main component along the top surface and the lateral surface of the organic electronic element, and forming a coating film; and (3) an ion implantation step of implanting plasma ions into the coating film, and forming a sealing layer.

That is, when a sealing layer is formed on an organic electronic element by directly applying a coating liquid containing a silicon compound as a main component, forming a coating film, and implanting plasma ions into the coating film, and thereby the sealing layer is provided directly along the top surface and the lateral surface of the organic electronic element, the organic electronic element can be sealed compactly and efficiently.

Furthermore, on the occasion of performing the method for manufacturing an organic electronic element of the present invention, it is preferable to use, in step (2), at least one selected from the group consisting of a polysilazane compound, a polyorganosiloxane compound, a polysilane compound, and a polycarbosilane compound as the silicon compound.

With such a silicon compound, a sealing layer having excellent transparency, adhesiveness or the like can be obtained.

Furthermore, on the occasion of performing the method for manufacturing an organic electronic element of the present invention, it is preferable that the coating film formed in step (2) is a film formed by directly applying a coating liquid containing a polysilazane compound as a main component, and the refractive index of the coating film is adjusted to a value within the range of 1.48 to 1.63 before the ion implantation step of step (3).

When the ion implantation step is carried out after the refractive index of the coating film is adjusted to a value within the range described above, a sealing layer having superior gas barrier properties can be obtained, and furthermore, durability of the organic electronic element such as an organic EL element can be further enhanced.

Furthermore, on the occasion of performing the method for manufacturing an organic electronic element of the present invention, it is preferable that the organic electronic element is an organic electroluminescent element (organic EL element) including an organic electroluminescent layer as an organic functional layer.

When an organic EL element is manufactured by such a method, the function as a sealing layer can be readily manifested, and even if the organic EL element has a large screen, or has surface unevenness on the top surface or the lateral surface of the organic electronic element, an organic EL element having remarkably enhanced durability can be manufactured efficiently.

MODE(S) FOR CARRYING OUT THE INVENTION

[First Embodiment]

The first embodiment is an organic electronic element 50 that includes, on a substrate 101, a first electrode 11 and a second electrode 22 facing each other, with at least one organic functional layer 99 being interposed therebetween, as illustrated in FIG. 4A, characterized in that a sealing layer 100 is provided directly along the top surface and the lateral surface of the organic electronic element 50, and the sealing layer 100 is obtained by implanting plasma ions into a coating film formed from a silicon compound as a main component.

Hereinafter, the organic electronic element of the first embodiment will be specifically described by taking the organic electroluminescent element (organic EL element) illustrated in FIG. 1 or the like as an example of the organic electronic element.

1. Basic Configuration of Organic EL Element

Figure 1A:
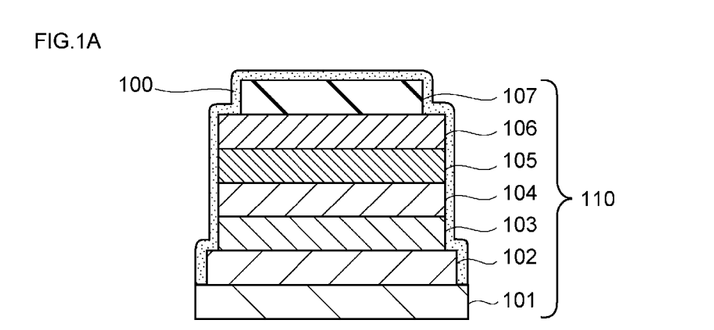
FIGS. 1A to 1C are diagrams each provided to describe an organic EL element including a sealing layer.

The basic configuration of the organic EL element is not particularly limited. For example, an organic EL element 110 has, as illustrated in FIG. 1A, a positive electrode 102 (first electrode) formed from a transparent conductive material, a hole transport layer 103 formed from an organic compound, a light emitting layer 104 (organic functional layer) formed from an organic compound, a hole blocking layer 105 formed from an organic compound, an electron transport layer 106 formed from an organic compound, and a negative electrode 107 (second electrode) formed from a metallic material, laminated on a transparent substrate 101, and a sealing layer 100 is provided directly along the top surface and the lateral surface of the organic EL element 110.

The organic EL element 110 can exhibit high-luminance EL light emission as a result of recombination of electrons and holes that are respectively injected from the electrodes.

Figure 1B:
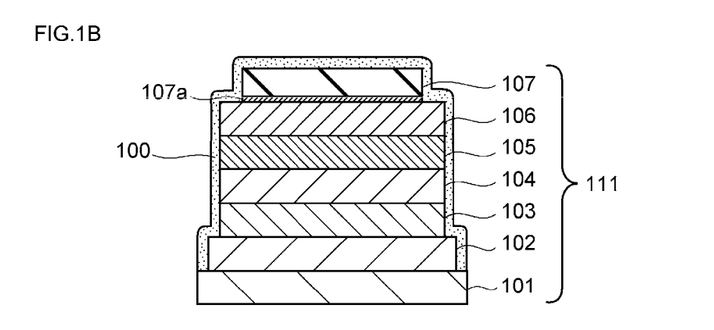

Furthermore, regarding the structure of another organic EL element 111, as illustrated in FIG. 1B, the sealing layer 100 is provided directly along the top surface and the lateral surface of the organic EL element 111 in which an electron injection layer 107a is laminated as a thin film between the electron transport layer 106 and the negative electrode 107.

Figure 1C:
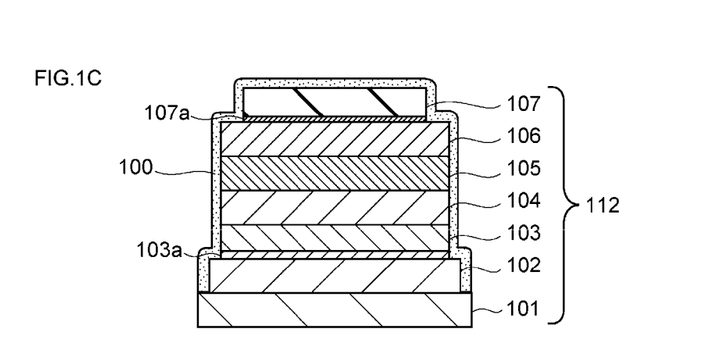

Furthermore, regarding the structure of still another organic EL element 112, as illustrated in FIG. 1C, the sealing layer 100 is provided directly along the top surface and the lateral surface of the organic EL element 112 in which a hole injection layer 103a is laminated as a thin film between the positive electrode 102 and the hole transport layer 103.

If the light emitting layer 104 is formed of a light emitting material having hole transportability, the organic EL elements 110 to 112 described above may have a structure lacking the hole transport layer 103 or the hole injection layer 103a.

Figure 2A:
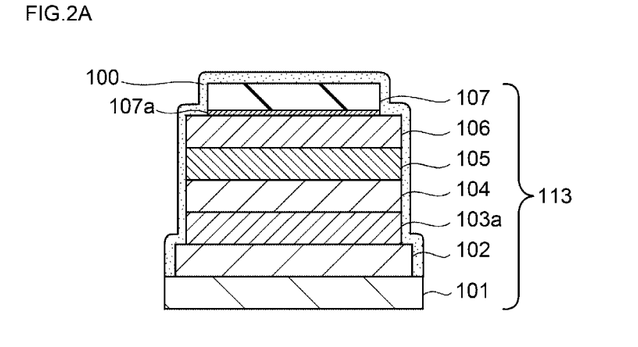
FIGS. 2A and 2B are diagrams each provided to describe an organic EL element including a sealing layer.

When the light emitting layer 104 is formed from a light emitting material having hole transportability, for example, as illustrated in FIG. 2A, the organic EL element 113 has a positive electrode 102, a hole injection layer 103a, a light emitting layer 104, a hole blocking layer 105, an electron transport layer 106, an electron injection layer 107a, and a negative electrode 107 sequentially laminated on the substrate 101, and a sealing layer 100 is provided directly along the top surface and the lateral surface of the organic electronic element. Thus, the organic EL element 113 is configured not to include a hole transport layer 103.

Figure 2B:
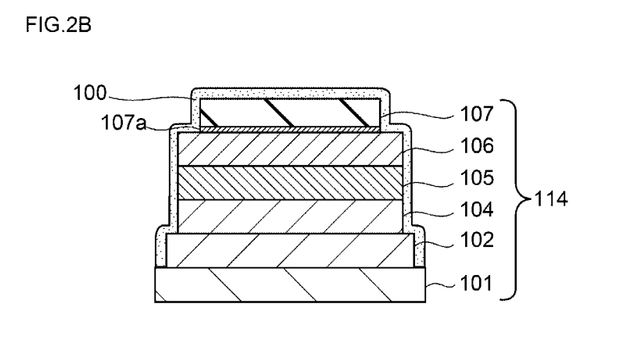

Furthermore, as illustrated in FIG. 2B, the organic EL element 114 has a positive electrode 102, a light emitting layer 104, a hole blocking layer 105, an electron transport layer 106, an electron injection layer 107a, and a negative electrode 107 sequentially laminated on a substrate 101, and a sealing layer 100 is provided directly along the top surface and the lateral surface of the organic electronic element. Thus, the organic EL element 114 is configured not to include a hole transport layer 103 and a hole injection layer 103a.

Meanwhile, the configuration of a substrate, a positive electrode, a hole transport layer, a light emitting layer, a hole blocking layer, an electron transport layer, and a negative electrode is not particularly limited, and a conventionally known configuration may be adopted.

Also, in the present invention, other layers may be provided as necessary, in addition to the layers described above.

(1) Substrate

The substrate 101 is not particularly limited, and examples include films and plates produced by any arbitrary method from inorganic materials such as alkali-free glass and quartz glass; and organic materials such as polyester, polycarbonate, polyolefin, polyamide, polyimide, polyphenylene sulfide, poly-para-xylene, epoxy resins, and fluoro resins.

(2) Positive Electrode and Negative Electrode

When the organic electronic element is an organic EL element illustrated in FIG. 1 and FIG. 2, the first electrode according to the present invention serves as the positive electrode 102. The positive electrode 102 (first electrode) is not particularly limited as long as it is transparent, and examples include electrodes formed from materials such as tin-doped indium oxide (ITO), $IrO_2$, $In_2O_3$, $SnO_2$, indium oxide zinc oxide (IZO), ZnO (Ga, Al-doped), and $MoO_3$.

Furthermore, when the organic electronic element is the organic EL element illustrated in FIG. 1 and FIG. 2, the second electrode according to the present invention serves as the negative electrode 107. For the negative electrode 107 (second electrode), there are no particular limitations on transparency, and examples include Ag, Al, Pt, Ir, Cr, ZnO, CNT, and alloys, composites and the like thereof.

There are no particular limitations on the method for forming a positive electrode and a negative electrode, and examples include vacuum deposition, and various sputtering methods.

Meanwhile, the thicknesses of the positive electrode and the negative electrode are not particularly limited; however, the thicknesses are preferably 20 nm to 1000 nm, and particularly preferably 30 nm to 200 nm.

(3) Light Emitting Layer

When the organic electronic element is the organic EL element illustrated in FIG. 1 and FIG. 2, the organic functional layer according to the present invention becomes the light emitting layer 104.

The light emitting layer 104 is a layer containing a luminescent material in which excitons are generated as a result of recombination of electrons and holes, and light is emitted when the excitons release energy and return to the ground state. Such a luminescent material can be used without any particular limitations, and usually, examples include an organic substance that emits fluorescent light, an organic substance that emits phosphorescent light, and luminescent materials such as the relevant organic substances together with impurities, metal complex-based materials, polymeric materials, colorant-based materials, and impurity materials that are auxiliary to the organic substances.

Furthermore, regarding the method for forming a light emitting layer, any method can be appropriately selected and used from various coating methods such as a vacuum deposition method, an ionization deposition method, spin coating (spin casting method), spray coating, gravure coating, bar coating, and doctor blade coating depending on the luminescent material. The light emitting layer is preferably formed by a coating method.

The thickness of the light emitting layer 104 is 1 μm to 100 μm, preferably 2 nm to 1,000 nm, more preferably 5 nm to 500 nm, and even more preferably 20 nm to 200 nm.

(4) Hole Transport Layer

The hole transport layer 103 is a layer having a function of transporting holes.

Furthermore, the hole transport layer may be a single layer, or may be a laminate of plural layers. It is preferable that the hole transport layer has a charge generating ability of absorbing light and generating electrons and holes.

Also, the hole transport layer may be formed using one kind or two or more kinds of hole transporting materials.

Here, examples of the hole transporting materials include a carbazole derivative, a polyarylalkane derivative, a phenylenediamine derivative, an arylamine derivative, an amino-substituted chalcone derivative, a styrylanthracene derivative, a fluorenone derivative, a hydrazone derivative, a stilbene derivative, a silazane derivative, an aromatic tertiary amine compound, a styrylamine compound, an aromatic dimethylidine-based compound, a porphyrin-based compound, a phthalocyanine-based compound, a polythiophene derivative, a polypyrrole derivative, and a poly-para-phenylenevinylene derivative.

Furthermore, examples of the method for forming the hole transport layer 103 include solvent coating methods such as spin coating, spray coating, bar coating, and die coating; and vacuum deposition methods.

Meanwhile, the thickness of the hole transport layer is preferably 1 nm to 500 nm, more preferably 2 nm to 200 nm, and even more preferably 5 nm to 100 nm.

(5) Hole Blocking Layer

It is preferable that the hole blocking layer 105 has a function of restricting holes that move from the positive electrode 102 toward the negative electrode 107. The material for the hole blocking layer 105 is not particularly limited, and the material can be appropriately selected according to the purpose.

Furthermore, the thickness of the hole blocking layer 105 is not particularly limited, and the thickness can be appropriately selected according to the purpose. For example, the thickness is usually about 1 nm to 500 nm, and preferably 10 nm to 50 nm.

(6) Electron Transport Layer

The electron transport layer 106 is a layer having a function of transporting electrons.

Furthermore, the electron transport layer 106 may be a single layer, or may be a laminate of plural layers. It is preferable that the electron transport layer 106 has a charge generating ability of absorbing light and generating an electric charge.

Also, the electron transport layer may be formed using one kind or two or more kinds of electron transporting materials.

Here, examples of the electron transporting material include a fullerene derivative, a para-phenylenevinylene derivative, a triazole derivative, an oxazole derivative, an oxadiazole derivative, a phenanthroline derivative, an imidazole derivative, a fluorenone derivative, an anthraquinodimethane derivative, an anthrone derivative, a diphenylquinone derivative, a thiopyran dioxide derivative, a carbodiimide derivative, a fluorenylidenemethane derivative, a distyrylpyrazine derivative; aromatic ring tetracarboxylic acid anhydrides of naphthalene, perylene and the like, and imides or heterocyclic rings derived therefrom; metal complexes of an 8-quinolinole derivative; various metal complexes represented by a metal complex having benzoxazole or benzothiazole as a ligand; and an organic silane derivative.

Furthermore, examples of the method for forming the electron transport layer 106 include solvent coating methods such as spin coating, spray coating, bar coating, and die coating; and vacuum deposition methods.

Meanwhile, the thickness of the electron transport layer 106 is preferably 1 nm to 500 nm, more preferably 2 nm to 200 nm, and even more preferably 5 nm to 100 nm.

2. Sealing Layer (1) Basic Configuration

The sealing layer 100 illustrated in FIGS. 1A to 1C and FIGS. 2A to 2B is a layer obtained by implanting plasma ions into a coating film containing a silicon compound as a main component.

That is, the present invention is characterized in that when a coating film is formed all over by directly applying a material containing a silicon compound as a main component on the top surface and the lateral surface of the organic EL element (110, 111, 112, 113, or 114), and plasma ions are implanted into the coating film, a sealing layer is formed.

As such, since the sealing layer covers three-dimensionally the top surface and the lateral surface of these organic EL elements, oxygen, water vapor and the like can be prevented from penetrating into the interior of the organic EL element, and thus deterioration of the performance of the organic EL element can be suppressed.

Figure 4B:
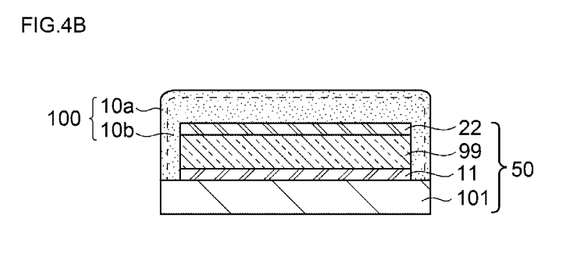
Figure 4C:
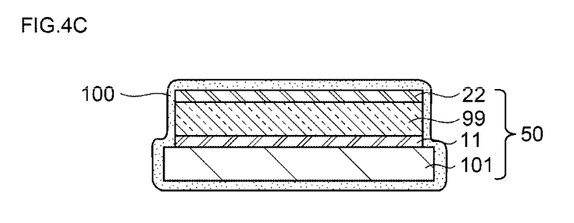

Meanwhile, regarding the sealing layer 100, as illustrated in FIG. 4C, the sealing layer 100 may be provided on the top surface (in FIG. 4, the opposite side of the side where the organic functional layer 99, the first electrode 11, and the second electrode 22 are laminated) and the lateral surface of the substrate 101, or on any one of the surfaces.

As such, by having the sealing layer 100 even on the surface of the substrate 101, infiltration of oxygen, water vapor or the like through the substrate 101 can be prevented, and therefore, deterioration of the organic electronic element 50 can be further suppressed.

(2) Thickness

Furthermore, the thickness of the sealing layer 100 preferably has a value within the range of 10 nm to 5000 nm. With such a thickness of the sealing layer, transparency is not decreased, and therefore, the gas barrier properties or adhesiveness can be further enhanced without decreasing the luminescence efficiency of the organic EL element or the like.

(3) Silicon Compound

Furthermore, the kind of the silicon compound is not particularly limited, but for example, it is preferable that the silicon compound is at least one selected from the group consisting of a polysilazane compound, a polyorganosiloxane compound, a polysilane compound, and a polycarbosilane compound.

The reason for this is that with such a silicon compound, the resulting sealing layer has excellent transparency or adhesiveness, and also, a sealing layer having excellent gas barrier properties can be obtained by implanting plasma ions.

The method for forming the sealing layer 100 will be described in detail by way of the method for manufacturing an organic electronic element that will be described below.

Thus, examples of the organic EL element as an organic electronic element have been described by taking the organic EL elements illustrated in FIG. 1 and FIG. 2 as examples; however, in the present invention, the organic electronic element is not intended to be limited to an organic EL element, and the organic electronic element may also be, for example, an organic solar cell having an organic photoelectric conversion layer as the organic functional layer.

3. Organic Solar Cell

Hereinafter, the case in which the organic electronic element is an organic solar cell will be described specifically.

The basic configuration of the organic solar cell is not particularly limited.

Figure 3:
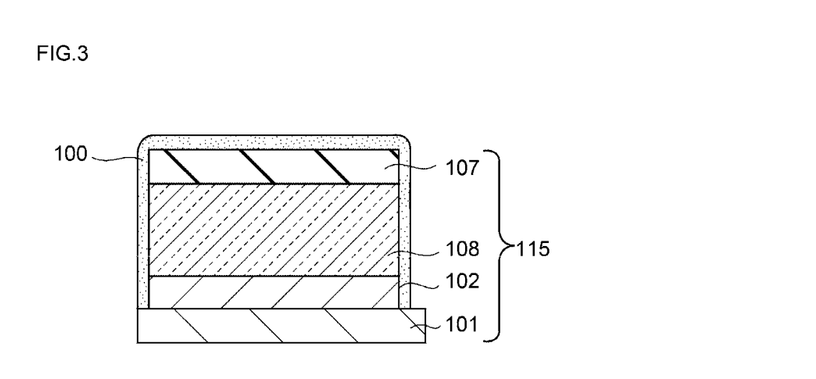
FIG. 3 is a diagram provided to describe an organic solar cell including a sealing layer.

Specifically, an organic solar cell 115 is formed, for example, as illustrated in FIG. 3, by laminating a positive electrode 102 (first electrode) formed from a transparent conductive material, an organic photoelectric conversion layer 108 (organic functional layer) formed from an organic compound, and a negative electrode 107 (second electrode) formed from a metallic material, on a transparent substrate 101. Further, a sealing layer 100 is provided directly along the top surface and the lateral surface of the organic solar cell 115.

The organic photoelectric conversion layer 108 has a function of absorbing light and generating electrons and holes.

Furthermore, the organic photoelectric conversion layer 108 may be composed of a single layer, or may be composed of plural layers. An example of a single layer may be a mixed layer of a hole transporting material and an electron transporting material. Furthermore, examples of plural layers include configurations of (hole transport layer/electron transport layer) and (hole transport layer/mixed layer/electron transport layer). FIG. 3 illustrates the case of a mixture of the materials.

In the present invention, other layers may be provided as necessary, in addition to the layers described above.

Meanwhile, for the positive electrode 102, negative electrode 107, and sealing layer 100, those described above can be used.

As described above, the organic electronic element of the present invention is sealed compactly and efficiently by the sealing layer formed three-dimensionally, not only on the top surface of the organic electronic element but also on the lateral surface. By means of this sealing layer, oxygen, water vapor and the like can be prevented from penetrating into the interior of the organic electronic element, and deterioration of the performance of the various organic electronic elements such as an organic EL element and an organic solar cell can be suppressed.

[Second Embodiment]

The second embodiment is an organic electronic element 50 that includes, as illustrated in FIG. 4B, a first electrode 11 and a second electrode 22 facing each other on a substrate 101, with at least one layer of organic functional layer 99 being interposed therebetween, characterized in that a sealing layer 100 is provided directly along the top surface and the lateral surface of the organic electronic element 50, the sealing layer 100 is obtained by implanting plasma ions into a coating film containing a polysilazane compound as a main component, and the sealing layer includes a first region 10a having a refractive index value within the range of 1.50 to 2.0 and a second region 10b having a refractive index value within the range of 1.40 to below 1.50, along the depth direction from the surface side.

Furthermore, the basic configuration of the organic electronic element 50 is not particularly limited, and examples include the same organic EL elements illustrated in FIG. 1 and FIG. 2, and the same organic solar cell illustrated in FIG. 3.

Hereinafter, the sealing layer 100 according to the second embodiment will be described specifically.

1. Refractive Index

It is preferable for the organic electronic element 50 illustrated in FIG. 4B that the sealing layer 100 include a first region 10a having a refractive index value within the range of 1.50 to 2.0 and a second region 10b having a refractive index value within the range of 1.40 to below 1.50, along the depth direction from the surface side.

The reason for this is that when the refractive index of the sealing layer is adjusted to the range such as described above, excellent gas barrier properties are obtained, and also reflection at the sealing layer can also be reduced. Therefore, superior transparency and the like can be obtained.

It is more preferable to adjust the refractive index in the first region to a value within the range of 1.50 to 1.66, and the refractive index in the second region to a value within the range of 1.42 to 1.49; and it is even more preferable to adjust the refractive index in the first region to a value within the range of 1.51 to 1.60, and the refractive index in the second region to a value within the range of 1.44 to 1.48.

2. Film Density

Furthermore, it is preferable to adjust the film density in the first region 10a to a value within the range of 2.3 $g/cm^3$ to 4.0 $g/cm^3$, and to adjust the film density in the second region 10b to a value of below 2.3 $g/cm^3$.

The reason for this is that when the film densities of the various regions are limited as such, superior transparency or superior gas barrier properties for the sealing layer can be obtained.

It is more preferable to adjust the film density in the first region to a value within the range of 2.4 $g/cm^3$ to 2.9 $g/cm^3$, and to adjust the film density in the second region to a value within the range of 1.8 $g/cm^3$ to 2.2 $g/cm^3$; and it is more preferable to adjust the film density in the first region to a value within the range of 2.5 $g/cm^3$ to 2.8 $g/cm^3$, and to adjust the film density in the second region to a value within the range of 1.9 $g/cm^3$ to 2.1 $g/cm^3$.

3. Thickness

The thickness of the sealing layer 100 preferably has a value within the range of 10 nm to 5000 nm. With such a thickness of the sealing layer, since transparency is not decreased, the gas barrier properties or adhesiveness can also be further enhanced without decreasing the luminescence efficiency of the organic EL element or the like.

Furthermore, it is preferable to adjust the thickness in the first region 10a to a value within the range of 10 nm to below 15 nm, and to adjust the thickness in the second region 10b to a value within the range of 10 nm to 30 nm.

The reason for this is that when the thicknesses of the various regions are limited, and the refractive indices thereof are adjusted as described above, superior gas barrier properties, transparency and the like can be obtained.

[Third Embodiment]

The third embodiment is a method for manufacturing an organic electronic element that includes, on a substrate, a first electrode and a second electrode facing each other, with at least one organic functional layer being interposed therebetween, characterized in that a sealing layer is provided directly along the top surface and the lateral surface of the organic electronic element, the method including steps (1) to (3) described below:

(1) an organic electronic element forming step of forming an organic electronic element including, on a substrate, a first electrode and a second electrode facing each other, with at least one organic functional layer being interposed therebetween;

(2) a film forming step of directly applying a coating liquid containing a silicon compound as a main component along the top surface and the lateral surface of the organic electronic element, and forming a coating film; and (3) an ion implantation step of implanting plasma ions into the coating film, and forming a sealing layer.

Hereinafter, the method for manufacturing an organic electronic element of the third embodiment will be described specifically by taking an organic EL element as an example of the organic electronic element.

1. Step (1): Organic Electronic Element Forming Step

Figure 5A:
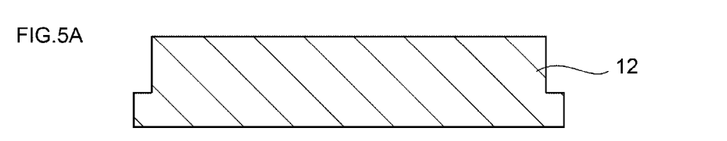
FIGS. 5A to 5E are diagrams each provided to describe a method for manufacturing an organic electronic element of the present invention.

The organic electronic element forming step is a step of forming an organic electronic element 12 that includes, on a substrate, a first electrode and a second electrode facing each other, with at least one organic functional layer being interposed therebetween, as illustrated in FIG. 5A, by a known method.

That is, when a case in which the organic electronic element 12 is the organic EL element 110 of FIG. 1A, is taken as an example, the organic EL element 110 can be formed by laminating, on a substrate 101 having a transparent positive electrode 102 formed thereon, a hole transport layer 103, a light emitting layer 104 as an organic functional layer, a hole blocking layer 105, an electron transport layer 106, and a negative electrode 107 in this order.

The method for forming the various layers is not particularly limited, and various known forming methods may be used.

2. Step (2): Film Forming Step

Figure 5B:
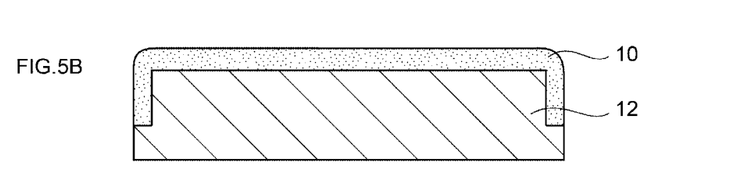

Subsequently, the coating step is a step of applying a coating liquid containing a silicon compound as a main component along the top surface and the lateral surface of the organic electronic element 12 formed in the step (1), and directly forming a coating film 10 on the top surface and the lateral surface of the organic electronic element 12, as illustrated in FIG. 5B.

Furthermore, examples of the silicon compound include a polysilazane compound, a polyorganosiloxane compound, a polysilane compound, and a polycarbosilane compound.

The coating liquid containing a silicon compound as a main component may be produced by mixing at least one kind of the silicon compound with other components as desired, and dissolving the mixture in a solvent.

Figure 5C:
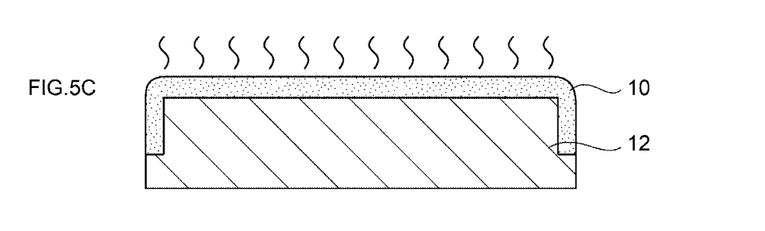

Furthermore, regarding the method for forming a coating film, the coating film 10 can be formed by applying a coating liquid containing a silicon compound as a main component on the organic EL element 12, forming a coating film, and removing the solvent in the coating film by heating and drying as illustrated in FIG. 5C.

Furthermore, regarding the method for heating and drying the coating film, conventionally known drying methods such as hot air drying, hot roll drying, and infrared drying can be employed. The heating temperature is usually 80° C. to 150° C., and the heating time is usually from several ten seconds to several ten minutes.

For the coating method, various known coating methods can be used.

Therefore, for example, a screen printing method, a knife coating method, a roll coating method, a die coating method, an inkjet method, a spin coating method, a spraying method, a dipping method and the like may be used singly, or in combination of two or more kinds.

As illustrated in FIG. 4C, when the sealing layer 100 is formed on the top surface and the lateral surface of the substrate 101, or on any one of the surfaces, it is desirable to form a coating film 10 by the same method in step (2).

Also, a seasoning treatment step for the coating film 10 may be provided in step (2).

Regarding the seasoning conditions for the silicon compound, it is preferable to adjust the temperature to 15° C. to 35° C., and the treatment time to a value within the range of 24 hours to 480 hours.

In addition to that, for example, when a polysilazane compound is used as the silicon compound, it is preferable to adjust the refractive index of the coating film formed in step (2) to a value within the range of 1.48 to 1.63.

The reason for this is that by having the refractive index limited to such a value, superior gas barrier properties can be obtained when plasma ion implantation of step (3) is carried out.

3. Step (3): Plasma Ion Implantation Step (1) Basic Method

Figure 5D:
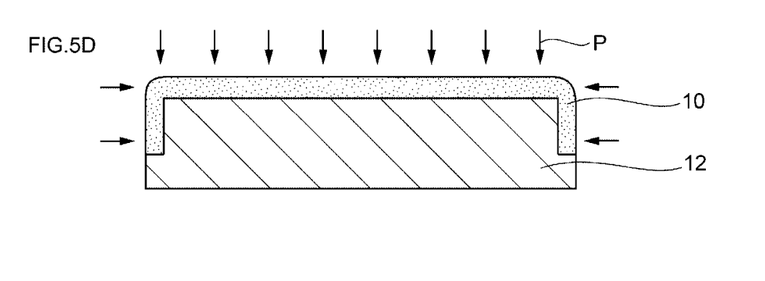
Figure 5E:
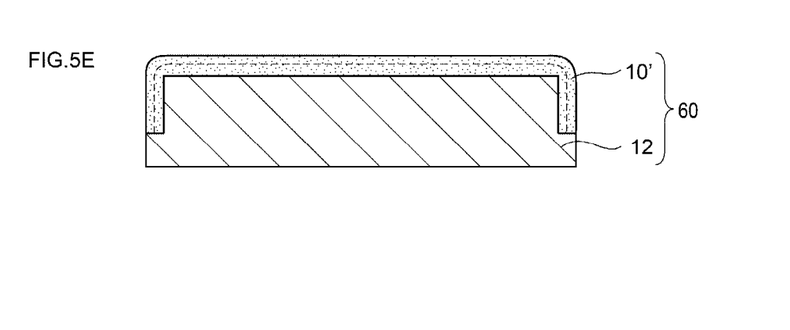

Step (3) is a step of performing plasma ion implantation to the coating film 10 as illustrated in FIG. 5D, implanting ions as represented by the arrow P, and finally obtaining an organic electronic element 60 having a sealing layer 10' as illustrated in FIG. 5E.

More specifically, regarding the plasma ion implantation, a basic method involves generating plasma in an atmosphere containing a plasma generating gas such as a noble gas, applying a negative high voltage pulse, and thereby implanting ions (cations) in the plasma to the surface area of the coating film 10.

Figure 6:
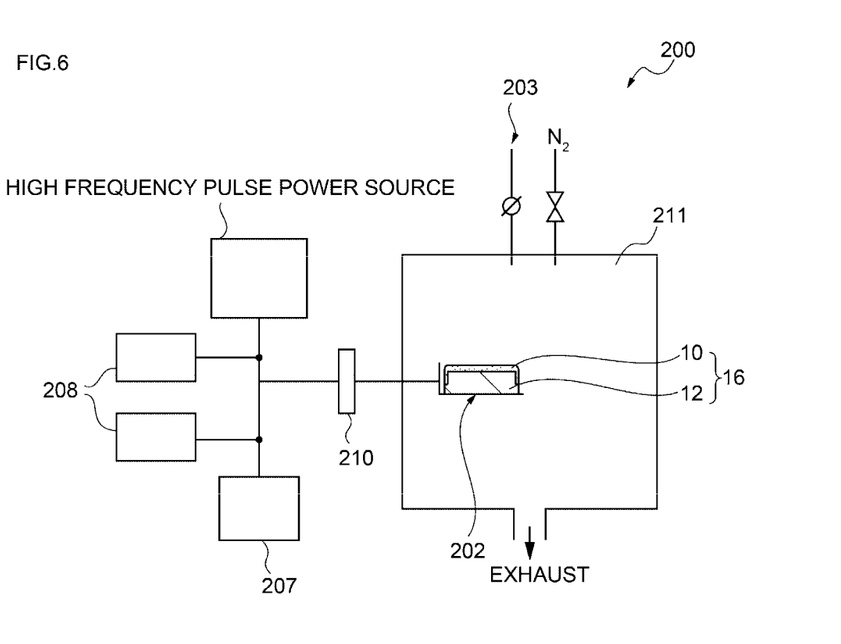
FIG. 6 is a diagram provided to describe an example of the ion implantation apparatus.

Furthermore, as an example, the plasma ion implantation apparatus 200 illustrated in FIG. 6 can be used.

That is, such a plasma ion implantation apparatus 200 basically includes a vacuum chamber 211, a microwave power source (not shown in the diagram), a magnet coil (not shown in the diagram), and a direct current application apparatus (pulse power source) 208.

The vacuum chamber 211 is a vessel for disposing an object to be treated 16, which is the organic electronic element 12 having the coating film 10 formed thereon, at a predetermined position inside the chamber, and also for performing ion implantation into the coating film.

Furthermore, the direct current application apparatus 208 is a direct current power source equipped with an oscilloscope 207, and is a pulse power source for applying a high voltage pulse to the object to be treated 16.

Therefore, the direct current application apparatus 208 is electrically connected to a conductor 202 on which the object to be treated 16 is disposed.

Therefore, according to the plasma ion implantation apparatus 200 configured as such, plasma of the gas introduced through the gas inlet port 203 is generated around the conductor 202 and the object to be treated 16, by driving the microwave power source (electrode for plasma discharge) and a magnet coil.

Subsequently, after the passage of a predetermined time, driving of the microwave power source and the magnet coil is stopped, and at the same time, the direct current application apparatus 208 is driven so that a high voltage pulse (negative voltage) is applied to the object to be treated 16 through a high voltage lead-in terminal 210 and the conductor 202.

Therefore, ion species in the plasma are induced and implanted into the coating film 10 by such application of a high voltage pulse (negative voltage).

(2) Ion Species

There are no particular limitations on the ion species that are introduced into the vacuum chamber described above and implanted into the coating film 10. Examples of the ion species include ions of noble gases such as argon, helium, neon, krypton, and xenon; ions of fluorocarbons, hydrogen, nitrogen, oxygen, carbon dioxide, chlorine, fluorine, sulfur, and the like; ions of alkane-based gases such as methane, ethane, propane, butane, pentane, and hexane; ions of alkene-based gases such as ethylene, propylene, butene, and pentene; ions of alkadiene-based gases such as pentadiene and butadiene; ions of alkyne-based gases such as acetylene and methylacetylene; ions of aromatic hydrocarbon-based gases such as benzene, toluene, xylene, indene, naphthalene, and phenanthrene; ions of cycloalkane-based gases such as cyclopropane and cyclohexane; ions of cycloalkene-based gases such as cyclopentene and cyclohexene; ions of conductive metals such as gold, silver, copper, platinum, nickel, palladium, chromium, titanium, molybdenum, niobium, tantalum, tungsten, and aluminum; and ions of silane ($SiH_4$) and organosilicon compounds.

Among these, from the viewpoint that a sealing layer that can be implanted more conveniently and has excellent gas barrier properties is obtained, at least one kind of ion selected from the group consisting of hydrogen, nitrogen, oxygen, argon, helium, neon, xenon, and krypton is preferred.

(3) Plasma Ion Implantation Pressure

Furthermore, the pressure of the vacuum chamber at the time of implanting ions, that is, the plasma ion implantation pressure, is preferably adjusted to a value within the range of 0.01 Pa to 1 Pa.

The reason for this is that when the pressure at the time of such as plasma ion implantation is in this range, ions can be uniformly implanted conveniently and efficiently, and a sealing layer having both excellent bending resistance and excellent gas barrier properties can be formed efficiently.

Therefore, it is more preferable to adjust the plasma ion implantation pressure to a value within the range of 0.02 Pa to 0.8 Pa, and even more preferable to adjust the plasma ion implantation pressure to a value within the range of 0.03 Pa to 0.6 Pa.

(4) Plasma Ion Implantation Application Voltage

Furthermore, it is preferable to adjust the applied voltage (high voltage pulse/negative voltage) at the time of ion implantation to a value within the range of −1 kV to −50 kV.

The reason for this is that if such an applied voltage is not in the range described above, desired gas barrier properties may not be obtained in some cases.

Therefore, it is more preferable to adjust the applied voltage at the time of ion implantation to a value within the range of −1 kV to −15 kV, and even more preferable to adjust the applied voltage to a value within the range of −5 kV to −8 kV.

4. Other Steps

Furthermore, other layers may also be formed in the organic electronic element by providing various layer forming steps.

For example, it is also preferable to form an optical adjustment layer, an inorganic thin film layer, a gas barrier layer, or the like at the surface of the sealing layer for an enhancement of optical characteristics, durability, mechanical characteristics, and the like.

Also, for an enhancement of the decorativeness or informativeness of the organic electronic element, it is also preferable to form a decorative layer or a printed layer (including a metal deposit layer) over the entire surface or on a part of the surface of the sealing layer or the substrate.

EXAMPLES

Hereinafter, the present invention will be described in more detail by way of Examples.

Example 1

1. Production of Organic EL Element (1) Step (1): Luminescent Element Forming Step An ITO thin film-attached glass substrate provided in advance with an indium tin oxide thin film (ITO) (thickness: 150 nm, sheet resistance: 30Ω/□) as a positive electrode (first electrode) was prepared, and the ITO thin film surface was subjected to solvent washing and a UV/ozone treatment.

Subsequently, on the ITO thin film of the ITO thin film-attached glass substrate, N,N'-bis(naphthalen-1-yl)-N,N'-bis(phenyl)benzidine) to a thickness of 60 nm, tris(8-hydroxylquinolinato)aluminum to a thickness of 10 nm, and (8-hydroxyquinolinolato)lithium to a thickness of 10 nm, all being luminescent materials, were sequentially deposited respectively at a deposition rate of 0.1 nm/s to 0.2 nm/s, and thus a light emitting layer (organic functional layer) was formed.

Meanwhile, the luminescent materials used were all products manufactured by Luminescence Technology Corp.

Subsequently, aluminum (Al) (manufactured by Kojundo Chemical Laboratory Co., Ltd.) was deposited thereon at a rate of 0.1 nm/s, and a negative electrode having a thickness of 100 nm was formed. Thus, an organic EL element (organic electronic element) before sealing was prepared.

Meanwhile, for the respective deposition treatments, the degree of vacuum was adjusted to $1 \times 10^{-4}$ Pa or less in all cases.

(2) Step 2: Coating Film Forming Step

Subsequently, a perhydropolysilazane-containing liquid (manufactured by Clariant Japan K.K., "AQUAMICA NL110A-29", solvent: xylene, concentration: 10% by weight) as a coating liquid containing a silicon compound as a main component was applied along the top surface and the lateral surface of the organic EL element thus obtained, using a spin coater (manufactured by Mikasa Co., Ltd., MS-A200, speed of rotation: 3000 rpm, rotation time: 30 seconds). Subsequently, the coating liquid was heat treated under the conditions of 120° C. and 2 minutes to remove the solvent in the coating film, and thereby a coating film was formed.

The coating film was further left to stand for 48 hours in an environment at 23° C. and 50% RH, and thus a coating film having a thickness of 50 nm was formed. The refractive index of the coating film thus obtained was 1.5505.

(3) Step 3: Plasma Ion Implantation Step

Subsequently, the coating film thus obtained was subjected to plasma ion implantation under the conditions described below, using a plasma ion implantation apparatus (RF power source: manufactured by JEOL, Ltd., RF56000, high voltage pulse power source: Kurita Seisakusho, Inc., PV-3-HSHV-0835), and thus an organic EL element (organic electronic element) of Example 1 having a sealing layer (thickness: 50 nm) provided directly along the top surface and the lateral surface of the organic EL element was obtained.

Chamber internal pressure: 0.2 Pa
Introduced gas: argon
RF output power: 1000 W
RF frequency: 1000 Hz
RF pulse width: 50 μsec
RF delay: 25 nsec
DC voltage: −10 kV
DC frequency: 1000 Hz
DC pulse width: 5 μsec
DC delay: 50 μsec
Duty ratio: 0.5%
Processing time: 300 sec 2. Evaluation of Organic EL Element and the Like The organic EL element having a sealing layer that was finally obtained through plasma ion implantation was subjected to the following evaluations.

(1) Evaluation of Organic EL Performance

The organic EL element having a sealing layer thus obtained was left to stand for 1000 hours in a standard environment (60° C., 90% RH), subsequently the organic EL element was operated, and the state of generation of dark spots (non-light emitting sites) was visually observed. Thus, the organic EL performance was evaluated according to the following evaluation criteria. The results thus obtained are presented in Table 2.

Very good: Generation of dark spots was not observed at all.

Good: The area of generation of dark spots was below 5% of the entire light-emitting area.

Fair: The area of generation of dark spots was below 10% of the entire light-emitting area.

Bad: The organic EL element did not operate, or the area of generation of dark spots was 10% or more of the entire light-emitting area.

(2) Refractive Index

The refractive index of the sealing layer thus obtained was measured dividedly in a first region and a second region, using a spectroscopic ellipsometer (manufactured by J.A. Woollam Japan Co., Inc.).

For the convenience of measurement, instead of the organic EL element, a sealing layer was formed on a PET film having a thickness of 150 m under the same conditions as the sealing layer described above, and the refractive index of that sealing layer was measured. The results thus obtained are presented in Table 2.

(3) Film Density

The film density of the sealing layer thus obtained was measured using an X-ray diffraction apparatus (manufactured by Rigaku Corp., fully-automated horizontal type multi-purpose X-ray diffraction apparatus SMART LAB).

For the convenience of measurement, instead of the organic EL element, a sealing layer was formed on a PET film having a thickness of 150 μm under the same conditions as the sealing layer described above, and the film density of that sealing layer was measured. The results thus obtained are presented in Table 2.

Example 2

In Example 2, an organic EL element was produced in the same manner as in Example 1, except that the thickness of the sealing layer was increased from 50 nm to 200 nm, and the organic EL performance was evaluated in the same manner as in Example 1.

Example 3

In Example 3, an organic EL element was produced in the same manner as in Example 1, except that the thickness of the sealing layer was further increased from 50 nm to 500 nm, and the organic EL performance was evaluated in the same manner as in Example 1.

Examples 4 to 6

In Examples 4 to 6, organic EL elements were produced in the same manner, except that the perhydropolysilazane-containing liquid used in Examples 1 to 3 as the coating liquid containing a silicon compound as a main component, was changed to a coating liquid containing a polyorganosiloxane as a main component ("KS853" manufactured by Shin-Etsu Chemical Co., Ltd.), and the organic EL performance was evaluated in the same manner as in Example 1. The results thus obtained are presented in Table 1.

Examples 7 to 9

In Examples 7 to 9, organic EL elements were produced in the same manner, except that the perhydropolysilazane-containing liquid used in Examples 1 to 3 as the coating liquid containing a silicon compound as a main component, was changed to a coating liquid containing a polysilane as a main component (manufactured by Osaka Gas Chemical Co., Ltd., a solution obtained by dissolving "OGSOL SI-10" in toluene/ethyl methyl ketone: 7/3, solid content concentration: 7%), and the organic EL performance was evaluated in the same manner as in Example 1. The results thus obtained are presented in Table 1.

Examples 10 to 12

In Examples 10 to 12, organic EL elements were produced in the same manner, except that the perhydropolysilazane-containing liquid used in Examples 1 to 3 as the coating liquid containing a silicon compound as a main component, was changed to a coating liquid containing a polycarbosilane as a main component (manufactured by Nippon Carbon Co., Ltd., a solution obtained by dissolving "NIPUSI Type S" in toluene/ethyl methyl ketone: 7/3, solid content concentration: 7%), and the organic EL performance was evaluated in the same manner as in Example 1. The results thus obtained are presented in Table 1.

Comparative Example 1

In Comparative Example 1, an organic EL element was produced in the same manner, except that the ion implantation step carried out in Example 1 was omitted, and the organic EL performance was evaluated in the same manner as in Example 1. The results thus obtained are presented in Table 1.

Comparative Example 2

In Comparative Example 2, an organic EL element was produced in the same manner as in Example 1, except that a silicon dioxide film ($SiO_2$ film) having a thickness of 200 nm was formed on the organic EL element by a sputtering method, and this was used as the sealing layer, while the ion implantation step carried out in Example 1 was omitted. The organic EL performance was evaluated in the same manner as in Example 1. The results thus obtained are presented in Table 1.

Comparative Example 3

In Comparative Example 3, an organic EL element was produced in the same manner as in Comparative Example 2, except that a silicon dioxide film ($SiO_2$ film) having a thickness of 200 nm was formed by a sputtering method, and the silicon dioxide film was subjected to the ion implantation step carried out in Example 1 to form a sealing layer. The organic EL performance was evaluated in the same manner as in Example 1. The results thus obtained are presented in Table 1.

Comparative Example 4

In Comparative Example 4, an organic EL element was produced in the same manner as in Example 1, except that a silicon nitride film (SiN film) having a thickness of 200 nm was formed by a sputtering method, and this was used as the sealing layer, while the ion implantation step carried out in Example 1 was omitted. The organic EL performance was evaluated in the same manner as in Example 1. The results thus obtained are presented in Table 1.

Comparative Example 5

In Comparative Example 5, an organic EL element was produced in the same manner as in Comparative Example 4, except that a silicon nitride film (SiN film) having a thickness of 200 nm was formed by a sputtering method, and the silicon nitride film was subjected to the ion implantation step carried out in Example 1. The organic EL performance was evaluated in the same manner as in Example 1. The results thus obtained are presented in Table 1.

Comparative Example 6

In Comparative Example 6, an organic EL element was produced in the same manner, except that a silicon oxynitride film (SiON film) having a thickness of 200 nm was formed by a sputtering method, and the silicon oxynitride film was subjected to the ion implantation step carried out in Example 1. The organic EL performance was evaluated in the same manner as in Example 1. The results thus obtained are presented in Table 1.

Comparative Example 7

In Comparative Example 7, a laminate film composed of a silicon dioxide film ($SiO_2$ film) having a thickness of 100 nm and a silicon oxynitride film (SiON film) having a thickness of 100 nm was formed by a sputtering method, and the ion implantation step carried out in Example 1 was omitted. The organic EL element was evaluated in the same manner as in Example 1. The results thus obtained are presented in Table 1.

It was found that since the organic EL elements of Examples had sealing layers obtainable by implanting plasma ions into coating films containing silicon compounds as main components, deterioration of the performance of the organic electronic elements was suppressed as compared with the organic EL elements of Comparative Examples.

TABLE 2

|  | Example 1 | Example 2 | Example 3 | Comparative Example 1 |
|---|---|---|---|---|
| Refractive index (—) | | | | |
| Second region | 1.4722 | 1.4711 | 1.4707 | 1.4511 |
| First region | 1.656 | 1.6068 | 1.5507 | 1.4511 |
| Film density (g/cm$^3$) | | | | |
| Second region | 2.27 | 2.2 | 2.11 | 2.01 |
| First region | 2.85 | 2.72 | 2.69 | 2.01 |

INDUSTRIAL APPLICABILITY

As discussed above, an organic electronic element including the sealing layer of the present invention is suitably used as an organic electronic device such as an organic EL element or an organic photoelectric conversion element. Also, such an organic electronic device is expected to be useful in applications such as, for example, display members of mobile telephones, displays, electronic paper and the like, or in organic solar cells.

EXPLANATIONS OF LETTERS OR NUMERALS

10: COATING FILM
10', 100: SEALING LAYER
10a: FIRST REGION
10b: SECOND REGION
11, 102: FIRST ELECTRODE
12: ORGANIC ELECTRONIC ELEMENT
22, 107: SECOND ELECTRODE
50, 60: ORGANIC ELECTRONIC ELEMENT HAVING SEALING LAYER
99, 104: ORGANIC FUNCTIONAL LAYER
100: SEALING LAYER

TABLE 1

| | Silicon compound | Method for forming sealing layer | Plasma ion implantation treatment | Thickness (nm) | Evaluation of organic EL element |
|---|---|---|---|---|---|
| Example 1 | Polysilazane | Coating | Present | 50 | Good |
| Example 2 | Polysilazane | Coating | Present | 200 | Very good |
| Example 3 | Polysilazane | Coating | Present | 500 | Very good |
| Example 4 | Polyorganosiloxane | Coating | Present | 50 | Good |
| Example 5 | Polyorganosiloxane | Coating | Present | 200 | Very good |
| Example 6 | Polyorganosiloxane | Coating | Present | 500 | Very good |
| Example 7 | Polysilane | Coating | Present | 50 | Good |
| Example 8 | Polysilane | Coating | Present | 200 | Very good |
| Example 9 | Polysilane | Coating | Present | 500 | Very good |
| Example 10 | Polycarbosilane | Coating | Present | 50 | Good |
| Example 11 | Polycarbosilane | Coating | Present | 200 | Very good |
| Example 12 | Polycarbosilane | Coating | Present | 500 | Very good |
| Comparative Example 1 | Polysilazane | Coating | Absent | 50 | Bad |
| Comparative Example 2 | $SiO_2$ | Sputtering | Absent | 200 | Fair |
| Comparative Example 3 | $SiO_2$ | Sputtering | Present | 200 | Fair |
| Comparative Example 4 | SiN | Sputtering | Absent | 200 | Fair |
| Comparative Example 5 | SiN | Sputtering | Present | 200 | Fair |
| Comparative Example 6 | SiON | Sputtering | Present | 200 | Fair |
| Comparative Example 7 | $SiO_2$, SiON | Sputtering | Absent | 200 (100 + 100) | Fair |

101: BASE MATERIAL
103: HOLE TRANSPORT LAYER
103a: HOLE INJECTION LAYER
105: HOLE BLOCKING LAYER
106: ELECTRON TRANSPORT LAYER
107a: ELECTRON INJECTION LAYER
108: ORGANIC PHOTOELECTRIC CONVERSION LAYER
110, 111, 112, 113, 114: ORGANIC EL ELEMENT
115: ORGANIC SOLAR CELL
200: PLASMA ION IMPLANTATION APPARATUS
16: OBJECT TO BE TREATED
202: CONDUCTOR
203: GAS INLET PORT
207: OSCILLOSCOPE
208: DIRECT CURRENT APPLICATION APPARATUS (PULSE POWER SOURCE)
210: HIGH VOLTAGE LEAD-IN TERMINAL
211: VACUUM CHAMBER

The invention claimed is:

1. A method for manufacturing an organic electronic element that includes, on a substrate, a first electrode and a second electrode facing each other, with at least one organic functional layer being interposed therebetween, and has a sealing layer provided directly along the top surface and the lateral surface of the organic electronic element, the method comprising steps (1) to (3) described below:
(1) an organic electronic element forming step of forming the organic electronic element by sequentially laminating the first electrode, the at least one organic functional layer, and the second electrode, on the substrate;
(2) a film forming step of directly applying a coating liquid containing a silicon compound as a main component along the top surface and the lateral surface of the organic electronic element, and thereby forming a coating film; and
(3) an ion implantation step of implanting plasma ions into the coating film, and thereby forming the sealing layer, wherein the sealing layer includes a first region and a second region, the second region is between the first region and the top surface and the lateral surface of the organic electronic element, the first region has a film density value within the range of 2.3 $g/cm^3$ to 4.0 $g/cm^3$, and the second region has a film density value of below 2.3 $g/cm^3$.

2. The method for manufacturing an organic electronic element according to claim 1, wherein in step (2), at least one selected from the group consisting of a polysilazane compound, a polyorganosiloxane compound, a polysilane compound, and a polycarbosilane compound is used as the silicon compound.

3. The method for manufacturing an organic electronic element according to claim 1, wherein the coating film formed in step (2) is formed by directly applying the coating liquid containing a polysilazane compound as the main component, and the refractive index of the coating film is adjusted to a value within the range of 1.48 to 1.63 before the ion implantation step of step (3).

4. The method for manufacturing an organic electronic element according to claim 1, wherein the organic electronic element is an organic electroluminescent element, and the at least one organic functional layer comprises an organic electroluminescent layer.

5. The method for manufacturing an organic electronic element according to claim 1, wherein the thickness of the sealing layer is adjusted to a value within the range of 10 nm to 5000 nm.

6. The method for manufacturing an organic electronic element according to claim 1, wherein a refractive index in the first region of the sealing layer is adjusted to a value within the range of 1.50 to 2.0 and a refractive index in the second region of the sealing layer is adjusted to a value within the range of 1.40 to below 1.50.

* * * * *